US009608213B2

United States Patent
Wakaoka et al.

(10) Patent No.: US 9,608,213 B2
(45) Date of Patent: Mar. 28, 2017

(54) METHOD FOR MANUFACTURING FUNCTIONAL MATERIAL AND ELECTRONIC COMPONENT

(71) Applicant: MURATA MANUFACTURING CO., LTD., Nagaokakyo-shi, Kyoto-Fu (JP)

(72) Inventors: Takuo Wakaoka, Nagaokakyo (JP);
Koji Murayama, Nagaokakyo (JP);
Hiroshi Takagi, Nagaokakyo (JP);
Haruya Miyata, Nagaokakyo (JP);
Yoshihiko Takano, Nagaokakyo (JP);
Yasuaki Kainuma, Nagaokakyo (JP)

(73) Assignee: MURATA MANUFACTURING CO., LTD., Nagaokakyo-shi, Kyoto-fu (JP)

( * ) Notice: Subject to any disclaimer, the term of this patent is extended or adjusted under 35 U.S.C. 154(b) by 148 days.

(21) Appl. No.: 14/317,011

(22) Filed: Jun. 27, 2014

(65) Prior Publication Data

US 2014/0306183 A1    Oct. 16, 2014

Related U.S. Application Data

(63) Continuation of application No. PCT/JP2012/075339, filed on Oct. 1, 2012.

(30) Foreign Application Priority Data

Dec. 28, 2011  (JP) .................... 2011-288350

(51) Int. Cl.
*H01L 33/26* (2010.01)
*H01L 51/00* (2006.01)
(Continued)

(52) U.S. Cl.
CPC .......... *H01L 51/0092* (2013.01); *B82Y 10/00* (2013.01); *C01B 19/007* (2013.01);
(Continued)

(58) Field of Classification Search
CPC ......... H01L 33/26; H01L 51/00; H01L 29/00;
C01B 19/00; B82Y 10/00; B82Y 30/00;
B82Y 40/00
See application file for complete search history.

(56) References Cited

U.S. PATENT DOCUMENTS

2002/0132159 A1   9/2002 Ohya et al.
2005/0082521 A1   4/2005 Torimoto et al.
(Continued)

FOREIGN PATENT DOCUMENTS

CN    1375886 A    10/2002
CN    1483514 A     3/2004
(Continued)

OTHER PUBLICATIONS

"Studies on Synthesis and Properties of Porous Coordination Polymers"; Bulletin of Japan Society of Coordination Chemistry, 2008, vol. 51, pp. 13-19.
(Continued)

*Primary Examiner* — Humera Sheikh
*Assistant Examiner* — Lucas Wang
(74) *Attorney, Agent, or Firm* — Arent Fox LLP

(57) ABSTRACT

A method for manufacturing a functional material including a porous metal complex with nanoparticles included therein, the method including a configuration of adding more than one particle constituent raw material constituting the nanoparticles and a porous metal complex to a solvent, and then synthesizing nanoparticles included in the porous metal complex by heating to a desired temperature. In addition, provided is an electronic component including an electronic component element using a functional material including a porous metal complex with nanoparticles included therein.

17 Claims, 5 Drawing Sheets

(51) Int. Cl.
- *H01L 29/00* (2006.01)
- *C01B 19/00* (2006.01)
- *B82Y 30/00* (2011.01)
- *H01L 29/06* (2006.01)
- *H01L 29/15* (2006.01)
- *B82Y 10/00* (2011.01)
- *H01L 31/0352* (2006.01)
- *B82Y 40/00* (2011.01)

(52) U.S. Cl.
CPC ........ *H01L 29/0665* (2013.01); *H01L 29/151* (2013.01); *H01L 31/035218* (2013.01); *B82Y 30/00* (2013.01); *B82Y 40/00* (2013.01); *C01P 2004/04* (2013.01); *C01P 2004/64* (2013.01); *H01L 33/26* (2013.01)

(56) References Cited

U.S. PATENT DOCUMENTS

| | | | |
|---|---|---|---|
| 2007/0227898 A1* | 10/2007 | Muller | B01J 20/226 205/457 |
| 2008/0230750 A1 | 9/2008 | Gillies et al. | |
| 2010/0075437 A1 | 3/2010 | Naasani | |
| 2010/0322837 A1* | 12/2010 | Miller | C01B 3/0015 423/293 |
| 2012/0070904 A1* | 3/2012 | Stoddart | B01J 20/226 436/133 |
| 2013/0023402 A1 | 1/2013 | Yaghi et al. | |
| 2014/0186253 A1 | 7/2014 | Kitagawa et al. | |

FOREIGN PATENT DOCUMENTS

| | | |
|---|---|---|
| CN | 101752571 A | 9/2008 |
| CN | 101752571 A | 6/2010 |
| JP | 2003-261699 A | 9/2003 |
| JP | 2008-510852 a | 4/2008 |
| JP | 2008-198614 A | 8/2008 |
| JP | 2008-259993 A | 10/2008 |
| JP | 2008-287900 A | 11/2008 |
| JP | 04-276724 B2 | 6/2009 |
| JP | 2009-528251 A | 8/2009 |
| JP | 2010-013568 A | 1/2010 |
| WO | WO 2013/021944 A1 | 2/2013 |

OTHER PUBLICATIONS

Daniel Esken et al; "ZnO@ZIF-8: stabilization of quantum confined Zn) nanoparticles by a zinc methylimidazolate framework and their surface structural characterization probed by $CO_2$ adsorption": Journal of Materials Chemistry, 2011, vol. 21, pp. 5907-5915.

Daniel Esken, et al.; "Au@ZIFs: Stabilization and Encapsulation of Cavity-Size Matching Gold Clusters inside Functionalized Zeolite Imidazolate Frameworks, ZIFs": Chemistry of Materials, published Nov. 12, 2010, vol. 22, No. 23, pp. 6393-6401.

Felicitas Schroder et al.; "Ruthenium Nanoparticles Inside Porous [Zn4O(bdc)3] by Hydrogenolysis of Absorbed [Ru(cod)(cot)]: A Solid-State Reference System for Surfactant-Stabilized Ruthenium Colloids"; Journal of the American Chemical Society, 2008. vol. 130, No. 19, pp. 6119-6130.

Olivia Niitsoo et al.; "Chemical bath deposited CdS/CdSe-sensitized porous $TiO_2$ solar cells": Journal of Photochemistry and Photobiology A: Chemistry, vol. 181, 2006, pp. 306-313.

Hai-Long Jiang et al.; "Synergistic Catalysis of Au@Ag Core-Shell Nanoparticles Stabilized on Metal-Organic Framework"; Journal of the American Chemical Society, Jan. 7, 2011, vol. 133, No. 5, pp. 1304-1306.

Xiaojun Gu, et al.; "Synergistic Catalyst of Metal-Organic Framework-Immobilized Au-Pd Nanoparticles in Dehydrogenation of Formic Acid for Chemical Hydrogen Storage"; Journal of the American Chemical Society, Jul. 15, 2011, vol. 133, No. 31, pp. 11822-11825.

Okazaki et al. One Step Preparation and Photosensitivity of Size-Quantized Cadmium Chalcogenide Nanoparticles Deposited on Porus Zinc Oxide Film Elecrodes:, Chemistry Letters vol. 36, No. 6, 2007, pp. 712-713.

* cited by examiner

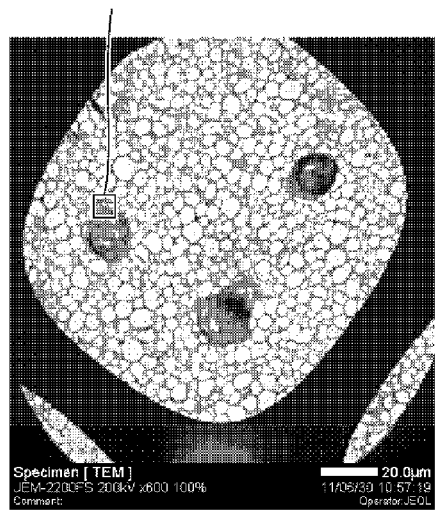
FIG. 3(a)
FIG. 3(b)
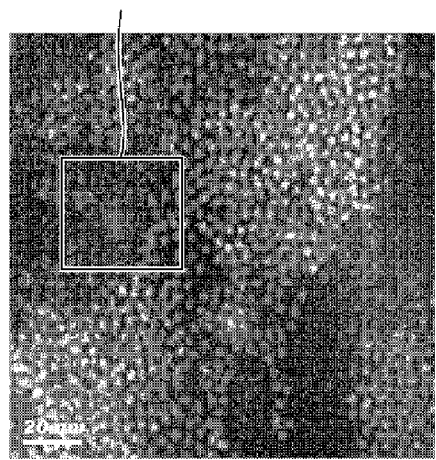
FIG. 3(c)
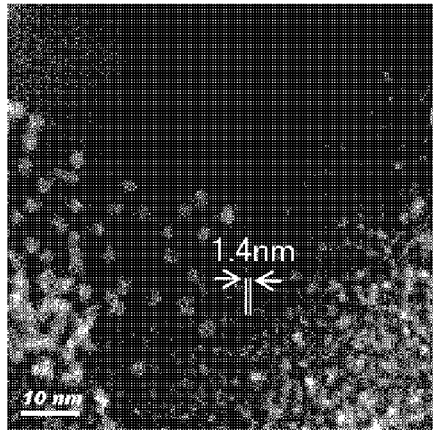
FIG. 3(d)

METHOD FOR MANUFACTURING FUNCTIONAL MATERIAL AND ELECTRONIC COMPONENT

CROSS REFERENCE TO RELATED APPLICATIONS

The present application is a continuation of International application No. PCT/JP2012/075339, filed Oct. 1, 2012, which claims priority to Japanese Patent Application No. 2011-288350, filed Dec. 28, 2011, the entire contents of each of which are incorporated herein by reference.

FIELD OF THE INVENTION

This invention relates to a method for manufacturing a functional material including a porous metal complex with nanoparticles included therein, and an electronic component.

BACKGROUND OF THE INVENTION

Patent Document 1 discloses the configuration of a light-emitting element that is high in emission intensity, and furthermore able to achieve emission wavelengths with a narrow full width at half maximum by arranging, to a light-emitting layer, quantum dots with rare earth atoms attached to a surface of the quantum dots. The methods for producing and arranging quantum dots, which are disclosed in Patent Document 1, are as follows.

As for the method for producing quantum dots, first, a porous silicon semiconductor substrate obtained by anodization is subjected to ultrasonic treatment. As a result, quantum dots of silicon are eliminated from the porous silicon semiconductor, and dispersed in a solvent. Then, the quantum dots dispersed in the solvent are sorted for each size with the use of a centrifuge to obtain quantum dots of silicon in almost the same particle size.

Next, as for the method for arranging quantum dots, a silicon alkoxide is hydrolyzed by mixing the quantum dots and the silicon alkoxide, and then adding thereto an alkali or an acid as a catalyst. In this way, a sol-like or gel-like product can be obtained. Next, the obtained product is attached to a substrate by screen printing, and further subjected to annealing treatment to arrange the quantum dots in a kind of dispersion state.

Patent Document 1: Japanese Patent Application Laid-Open No. 2008-198614

SUMMARY OF THE INVENTION

However, in regard to the above-described method for producing quantum dots, the sorting by size with the centrifuge has complicated processing, and has a limit on size control. In particular, in regard to small nanoparticles (several nm), the size control has been difficult. In addition, in regard to the arrangement method, it has been difficult to arrange nanoparticles at a high density just by applying the annealing treatment to the sol-like or gel-like product as described above.

Therefore, a main object of this invention is to provide a method for manufacturing a functional material, which makes it possible to finely control the particle sizes of nanoparticles, and makes it possible to arrange the nanoparticles closely at a high density. In addition, another object of the invention is to provide an electronic component that has an electromagnetic energy conversion efficiency improved by using the functional material for an electronic component element of the electronic component.

The method for manufacturing a functional material according to this invention is a method for manufacturing a functional material including a porous metal complex with nanoparticles included therein, the method including a step of adding more than one particle constituent raw material constituting the nanoparticles and a porous metal complex to a solvent, and then synthesizing nanoparticles included in the porous metal complex by heating to a desired temperature.

Further, the method for manufacturing a functional material according to this invention is preferably a method for manufacturing a functional material including a porous metal complex with nanoparticles included therein, the method including steps of: producing a first mixed solution by adding, to a solvent, a first particle constituent raw material as a metal compound for constituting the nanoparticles and a porous metal complex; producing a second mixed solution by adding a second particle constituent raw material constituting the nanoparticles to a solvent; and synthesizing nanoparticles included in the porous metal complex by mixing the second mixed solution with the first mixed solution.

Furthermore, the electronic component using the functional material according to this invention is an electronic component including an electronic component element using the functional material including a porous metal complex with nanoparticles included therein.

The method for manufacturing a functional material according to this invention is adapted to synthesize nanoparticles by mixing the porous metal complex and the nanoparticle constituent raw material, and thus provide nanoparticles included in the porous metal complex, thereby making it possible to finely control the particle sizes of the nanoparticles, and to achieve a functional material of the nanoparticles further closely arranged at a high density.

Furthermore, the electronic component according to this invention includes an electronic component element using a functional material including a porous metal complex with nanoparticles included therein so as to be closely arranged at a high density, and thus can achieve an electronic component that has an improved electromagnetic energy conversion efficiency.

This invention achieves a method for manufacturing a functional material, which makes it possible to finely control the particle sizes of nanoparticles, and makes it possible to arrange the nanoparticles closely at a high density, and achieves an electronic component with an electromagnetic energy conversion efficiency improved by using the functional material for an electronic component element of the electronic component.

The above-mentioned object, other objects, features, and advantages of this invention will be further evident from the following description with reference to the drawings.

BRIEF EXPLANATION OF THE DRAWINGS

FIGS. 3(a) to 3(d) show TEM (transmission electron microscope) images of a functional material manufactured by the method for manufacturing a functional material according to this invention, where FIG. 3(a) is an image at a low magnification under a TEM (transmission electron microscope), FIG. 3(b) is an enlarged image in a frame in FIG. 3(a), FIG. 3(c) is an enlarged image in a frame in FIG. 3 (b), and FIG. 3(d) is an enlarged image of a portion of FIG. 3(c).

DETAILED DESCRIPTION OF THE INVENTION (Functional Material)

Figure 1:
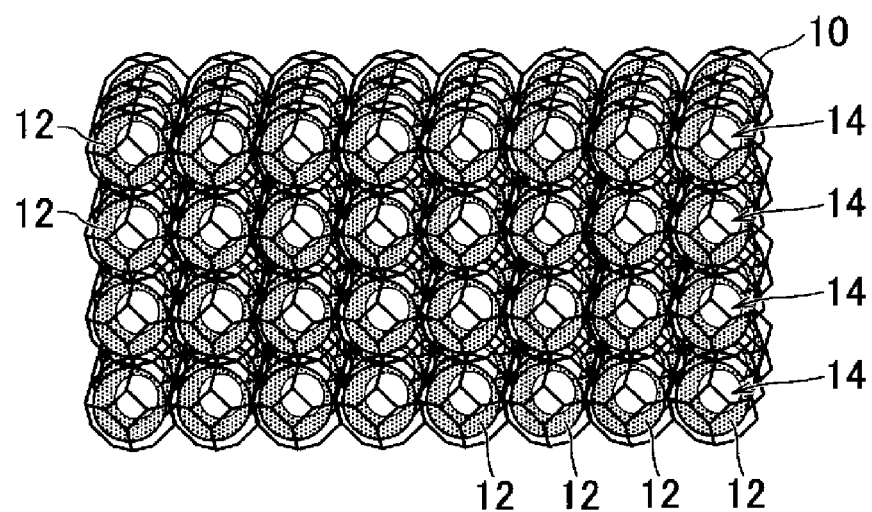
FIG. 1 is a schematic diagram illustrating an example of the structure of a functional material manufactured by a method for manufacturing a functional material according to this invention.

An example of a functional material will be described which is manufactured by a method for manufacturing a functional material according to the present invention. FIG. 1 is a schematic diagram illustrating an example of the structure of a functional material manufactured by a method for manufacturing a functional material according to the present invention.

This functional material is composed of a porous metal complex 10 and nanoparticles 12. For example, as a material for the porous metal complex 10, for example, a porous metal complex ZIF-8 (trade name, manufactured by BASF) is used which is composed of zinc nitrate and 2-methylimidazole. This porous metal complex 10 is structured to include a large number of pores 14 formed by a plurality of metal complex molecules integrated.

In addition, as shown in FIG. 1, the pores 14 of the porous metal complex 10 have the nanoparticles 12 at least supported thereon or included therein. For example, the nanoparticles 12 may be supported on the pores 14 of the porous metal complex 10, or supported on the surface of the porous metal complex 10. The term "included therein" represents herein the state where the nanoparticles 12 are confined within the porous metal complex 10, whereas the term "supported thereon" represents the state where the nanoparticles 12 adheres onto the porous metal complex. This functional material is composed of the porous metal complex 10 with the nanoparticles 12 closely arranged at a high density.

The nanoparticles 12 supported on or included in the porous metal complex 10 vary depending on electronic components to which the functional material is applied. Specifically, in the case of using the nanoparticles 12, for example, for a light-emitting layer of a light-emitting element or a light-receiving layer of a light-receiving element, semiconductor nanoparticles are used. For example, cadmium selenide (CdSe), cadmium telluride (CdTe), indium phosphide (InP), or the like is used as the semiconductor nanoparticles. Alternatively, for example, in the case of use for a magnetic recording layer of an information recording medium, magnetic nanoparticles are used. For example, a 3d transition element, a 4f transition element, an alkali metal, or an alloy thereof is used as the magnetic nanoparticles. Furthermore, for example, in the case of use for a single electron device, metal nanoparticles are used. For example, gold, silver, or copper is used as the metal nanoparticles.

(Method for Manufacturing Functional Material)

Next, a method for manufacturing the functional material described above will be described. The method for manufacturing the functional material according to the present invention is a manufacturing method for manufacturing a functional material including a porous metal complex with nanoparticles at least supported thereon or included therein, by synthesis with the use of the porous metal complex and nanoparticle constituent raw material. The method for manufacturing the functional material according to the present invention will be described below in detail.

Figure 2:
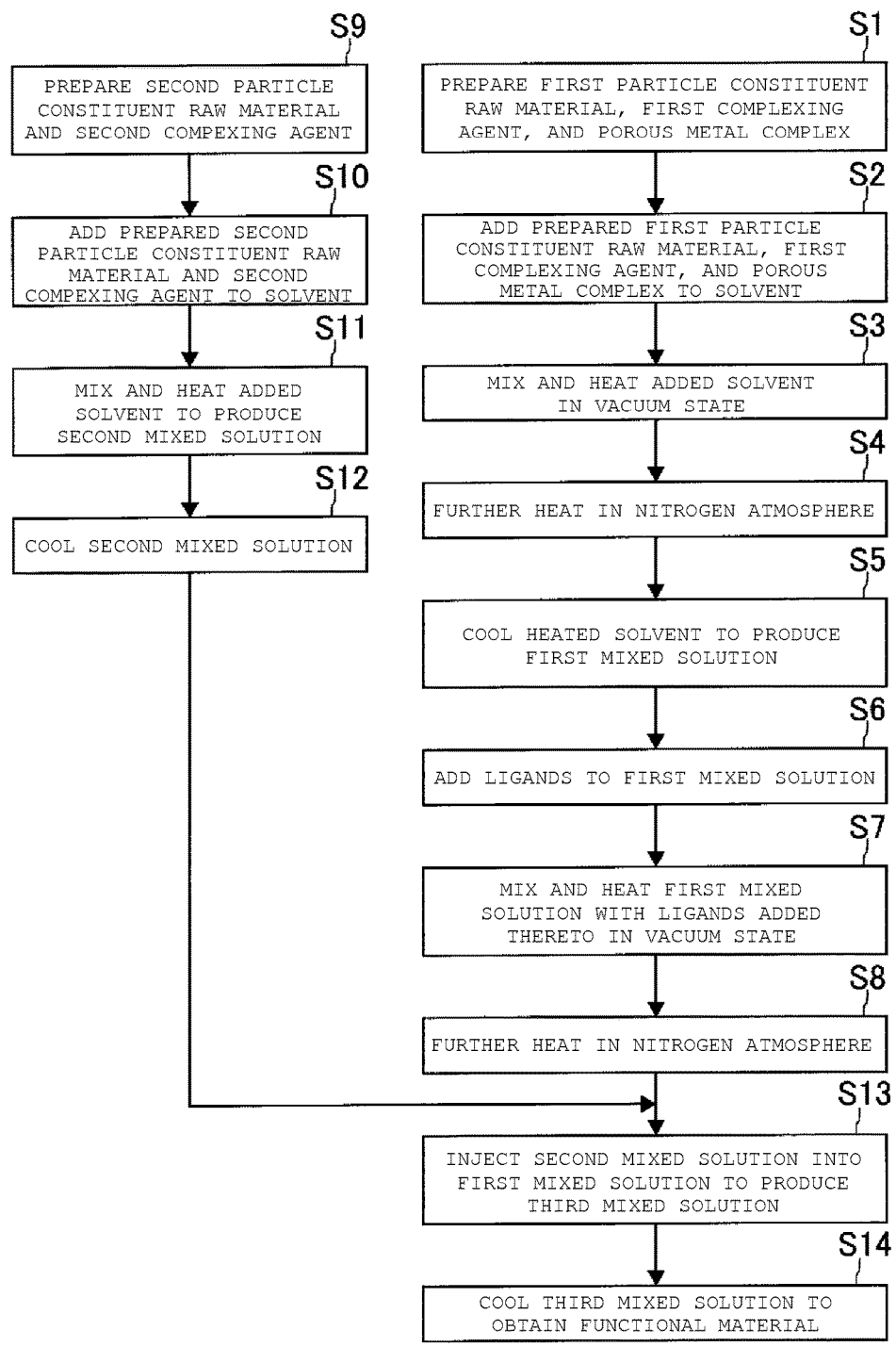
FIG. 2 is a flowchart showing an example of an embodiment of the method for manufacturing a functional material according to this invention.

FIG. 2 is a flowchart showing an example of an embodiment of the method for manufacturing the functional material according to this invention. First, in step S1, a first particle constituent raw material, a first complexing agent for the first particle constituent raw material, and a porous metal complex are prepared. The first particle constituent raw material is a metal compound for constituting nanoparticles. For example, cadmium (Cd), indium (In), cobalt (Co), Ni (nickel), chromium (Cr), or the like is used as the metal of the metal compound. As the first particle constituent raw material, a cadmium oxide (CdO) was used, and prepared was 213.6 mg (1.6 mmol) of cadmium oxide (CdO) with a purity of 4N. As the first complexing agent, for example, stearic acid (SA) was used, and prepared was 1.92 g (6.4 mmol) of stearic acid (SA) with a purity of 95%. In addition, as the porous metal complex, a porous metal complex ZIF-8 (trade name, manufactured by BASF) was used which is composed of zinc nitrate and 2-methylimidazole, and prepared was 5 mg of the porous metal complex ZIF-8.

Then, in step S2, the first particle constituent raw material and the first complexing agent are added to a solvent, to which the porous metal complex is further added. In this regard, as the solvent with the first particle constituent raw material, first complexing agent, and porous metal complex added thereto, for example, octadecene (ODE) is used, and prepared is 16 ml of octadecene (ODE) with a purity of 90%. Then, the first particle constituent raw material, first complexing agent, and porous metal complex prepared in step S1 were added to the prepared solvent.

Next, in step S3, the solvent with the first particle constituent raw material, first complexing agent, and porous metal complex added thereto was heated at, for example, 100° C. and mixed for 30 minutes in a vacuum state. Furthermore, in step S4, the mixed solvent was heated at 200° C. for 1 hour in a nitrogen atmosphere in order to avoid oxidation, and furthermore, in step S5, the heated solvent was cooled down to room temperature (25° C.) to produce a first mixed solution.

Subsequently, in step S6, ligands are added to the first mixed solution. As the ligands, for example, a mixture of trioctylphosphine oxide (TOPO) and octadecylamine (ODA) was used, and prepared were 4 g of trioctylphosphine oxide (TOPO) and 12 g of octadecylamine (ODA). The respective ligands prepared were added to the first mixed solution, heated to 100° C. in a vacuum state, and mixed for 30 minutes in step S7. It is to be noted that the ligands have an action to block detects when the particle constituent raw material has the defects. Thereafter, in step S8, the first mixed solution with the ligands added thereto was heated at 280° C. for 1 hour in a nitrogen atmosphere.

Next, in step S9, a second particle constituent raw material and a second complexing agent for the second particle constituent raw material are prepared. For the second particle constituent raw material, an element constituting nanoparticles is used, and for example, phosphorus (P), selenium (Se), tellurium (Te), or the like is used. As the second particle constituent raw material, pure selenium (Se) was used, and prepared was 1.26 g (16 mmol) of pure selenium (Se) with a purity of 4 N. As the second complexing agent, for example, tributylphosphine (TBP) was used, and prepared was 3.96 g (17.6 mmol) of tributylphosphine (TBP) with a purity of 90%.

Then, in step S10, the second particle constituent raw material and the second complexing agent are added to a solvent. In this regard, as the solvent with the second particle constituent raw material and second complexing agent added thereto, for example, octadecene (ODE) was used, and prepared was 10.96 ml of octadecene (ODE) with a purity of 90%. Then, the second particle constituent raw material and second complexing agent prepared in step S9 were added to the prepared solvent.

Next, in step S11, the solvent with the second particle constituent raw material and second complexing agent added thereto is heated at, for example, 100° C., and mixed to produce a second mixed solution.

Next, in step S12, the second mixed solution produced is cooled down to room temperature (25° C.). Then, in step S13, the second mixed solution cooled is mixed with the first mixed solution with the ligands added thereto to produce a third mixed solution. Then, the third mixed solution produced in step S13 was cooled down to room temperature (25° C.) to obtain a functional material with the CdSe nanoparticles included in ZIF-8. In this way, the nanoparticle nucleation can be stopped by mixing the second mixed solution cooled down to room temperature.

In this regard, FIGS. 3(a) to 3(d) are TEM (transmission electron microscope) images of a functional material manufactured by the method for manufacturing a functional material according to this invention. FIG. 3(a) is an image at a low magnification under a TEM (transmission electron microscope), FIG. 3(b) is an enlarged image in a frame in FIG. 3(a), FIG. 3(c) is an enlarged image in a frame in FIG. 3 (b), and FIG. 3(d) is an enlarged image of a portion of FIG. 3(c). Referring to FIGS. 3(A) to 3(d), it can be confirmed that CdSe nanoparticles are close at a high density to be at least supported on or included in ZIF-8 as a porous metal complex. The ZIF-8 as a porous metal complex has a pore size on the order of 1.2 nm. Therefore, nanoparticles on the order of 2 nm in diameter are formed outside pores of the porous metal complex, whereas nanoparticles on the order of 1 nm in diameter are formed inside the pores of the porous metal complex. It can be confirmed that the distances between the nanoparticles on the order of 1 nm, which are believed to be present in the pores, are very close on the order of 1 nm to 2 nm.

It is to be noted that the nanoparticles formed outside the pores of the porous metal complex can be reduced by adjusting the washing method or the synthesis method.

Accordingly, the method for manufacturing the functional material according to the present invention makes it possible to finely control the particle sizes of the nanoparticles, and makes it possible to arrange the nanoparticles closely at a high density, with the nanoparticles at least supported on or included in the porous metal complex. Specifically, the porous metal complex is able to form a regular basket-shaped framework of 0.1 nm or more. Therefore, the nanoparticles included in the pores of, or supported on the surface of the porous metal complex makes it possible to finely control the particle sizes of the nanoparticles. In addition, the very thin pore wall of the porous metal complex on the order of a sheet of benzene makes it possible to arrange the nanoparticles closely at a high density, with the nanoparticles included in the pores of, or supported on the surface of the porous metal complex.

(Electronic Component)

As described above, the functional material manufactured by the method for manufacturing a functional material according to the present invention makes it possible to finely control the particle sizes of the nanoparticles, and makes it possible to arrange the nanoparticles closely at a high density. Therefore, this functional material can be applied to an electronic component element of the following electronic component.

Figure 4:
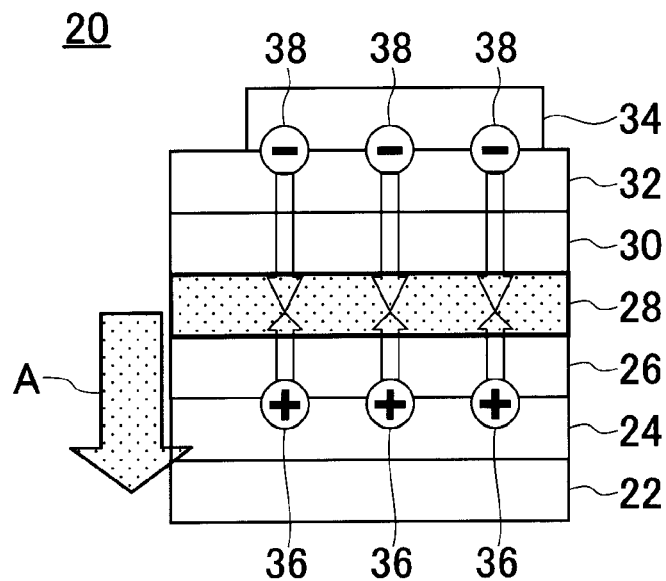
FIG. 4 is a cross-sectional schematic diagram illustrating an example of a light-emitting element as an embodiment of an electronic component with a functional material applied thereto, the functional material being manufactured by the method for manufacturing a functional material according to this invention.

FIG. 4 is a cross-sectional schematic diagram illustrating an example of a light-emitting element as an embodiment of an electronic component with a functional material applied thereto, the functional material being manufactured by the method for manufacturing a functional material according to the present invention. A light-emitting element 20 is composed of a glass substrate 22, an anode 24, a hole transporting layer 26, a light-emitting layer 28, a hole blocking layer 30, an electron transporting layer 32, and a cathode 34.

The glass substrate 22 is a support for the light-emitting element 20. The anode 24 is provided on the glass substrate 22. The anode 24 is provided for injecting holes 36 into the hole transporting layer 26. The hole transporting layer 26 is provided on the anode 24. The light-emitting layer 28 is provided on the hole transporting layer 26. The light-emitting layer 28 efficiently recombines, through the application of a voltage to the anode 24 and the cathode 32, the holes 36 injected from the anode 24 and transported through the hole transporting layer 26 and electrons 38 injected from the cathode 34 and transported through the hole blocking layer 30, and then generates excitons. For the light-emitting layer 28, a functional material is used which is manufactured by the method for manufacturing a functional material according to the present invention. The hole blocking layer 30 is provided on the light-emitting layer 28. The hole blocking layer 30 is provided for preventing the holes 36 moving from the light-emitting layer 28, from reaching the cathode, and further provided for efficiently transporting the electrons 38 injected from the cathode 34, to the light-emitting layer 28. While the cathode 34 is provided on the hole blocking layer 30, an electron transporting layer 32 is provided between the hole blocking layer 30 and the cathode 34 for the purpose of further improving the luminescent efficiency of the light-emitting element 20. The electron transporting layer 32 is provided for efficiently transporting the electrons 38 injected from the cathode 34 in a direction toward the hole blocking layer 30, through the application of a voltage to the anode 24 and the cathode 34.

In the light-emitting element 20, the holes 36 and the electrons 38 are injected respectively from the anode 24 and the cathode 34 through the application of a voltage to the anode and the cathode. The injected electrons 38 and holes 36 are recombined in the light-emitting layer 28, and excitons generated thereby produce luminescence. In this way, the light-emitting element 20 can emit light in a direction (a direction indicated by an arrow A) from the light-emitting layer 28 toward the glass substrate 22.

As described above, for the light-emitting layer 28 as an electronic component element, the functional material is used which is manufactured by the method for manufacturing a functional material according to the present invention, while semiconductor nanoparticles are used as the nanoparticles. In this way, the use of, for the light-emitting layer 28 of the light-emitting element, the functional material as a porous metal complex of the semiconductor nanoparticles (quantum dots) arranged at a high density can make the quantum dot diameters uniform to improve the luminance, and can increase the density of the quantum dots to improve the luminescent efficiency. Cadmium selenide (CdSe), cadmium telluride (CdTe), indium phosphide (InP), or the like is used as the semiconductor nanoparticles.

Further, in the case of use as an electronic component element of the light-emitting element, the luminescent efficiency can be further improved by removal of nanoparticles formed outside pores of the porous metal complex in the production of the functional material.

Figure 5:
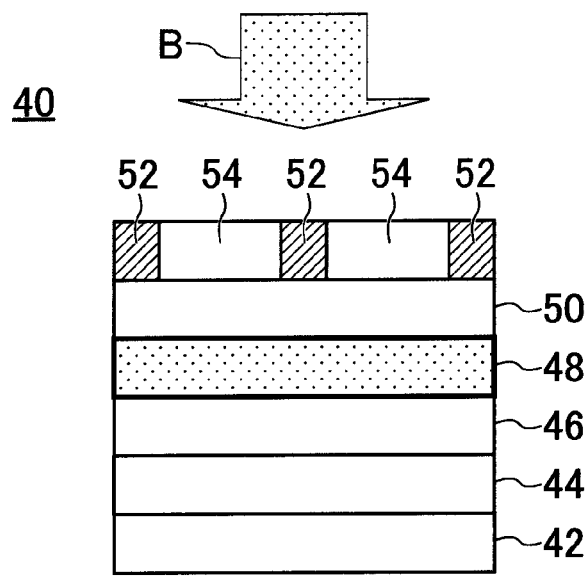
FIG. 5 is a cross-sectional schematic diagram illustrating an example of a light-receiving element as another embodiment of an electronic component with a functional material applied thereto, the functional material being manufactured by the method for manufacturing a functional material according to this invention.

FIG. 5 is a cross-sectional schematic diagram illustrating an example of a light-receiving element as another embodiment of an electronic component with a functional material applied thereto, is the functional material being manufactured by the method for manufacturing a functional material according to the present invention. A light-receiving element 40 is composed of an electrode 42, a semiconductor substrate 44, an n-type semiconductor layer 46, an i-type semiconductor layer 48, a p-type semiconductor layer 50, grid electrodes 52, and antireflection films 54.

The n-type semiconductor layer 46 is formed on one side of the semiconductor substrate 44. The i-type semiconductor layer 48 is formed on the n-type semiconductor layer 46. For the i-type semiconductor layer 48, a functional material is used which is manufactured by the method for manufacturing a functional material according to the present invention. The p-type semiconductor layer 50 is formed on the i-type semiconductor layer 48. Specifically, this light-receiving element 40 is a pin-junction type. The grid electrodes 52 are formed on the p-type semiconductor layer 50, and the antireflection films 54 are formed between the respective grid electrodes 52. The grid electrodes 52 are electrodes for extracting holes generated in the i-type semiconductor layer 48. In addition, the electrode 42 is formed on the other side of the semiconductor substrate 44. The electrodes 42 is an electrode for extracting electrons generated in the i-type semiconductor layer 48.

In the light-receiving element 40, when the i-type semiconductor layer 48 is irradiated with solar light by the incidence of solar light through the antireflection films 54 from a direction indicated by an arrow B, holes and electrons are generated to flow an electric current.

As described above, for the i-type semiconductor layer 48 as an electronic component element, the functional material is used which is manufactured by the method for manufacturing a functional material according to the present invention, while semiconductor nanoparticles are used as the nanoparticles. In this way, the use of, for the i-type semiconductor layer 48 as a light-receiving layer of the light-receiving element, the functional material as a porous metal complex of the semiconductor nanoparticles (quantum dots) closely arranged at a high density can make the quantum dot diameters uniform to improve the sensitivity, and can make the quantum dots closer to each other to expand the absorption band, that is, improve the conversion efficiency from light energy to electrical energy.

In addition, a functional material manufactured by the method for manufacturing a functional material according to the present invention can be used in a magnetic recording layer of a magnetic recording medium. Magnetic nanoparticles are used as nanoparticles of the functional material for use in the magnetic recording layer as an electronic component element. The use of a porous metal complex of the magnetic nanoparticles closely arranged at a high density can make the magnetic nanoparticles closer to each other to achieve a strongly-correlated device in which electrons and spins of the nanoparticles have influence on each other, which can be a high-density information recording medium with a high-density spin arrangement. A 3d transition element, a 4f transition element, an alkali metal, or an alloy thereof, for example, cobalt (Co), chromium (Cr), nickel (Ni), or the like is used as a material for the magnetic nanoparticles.

Figure 6:
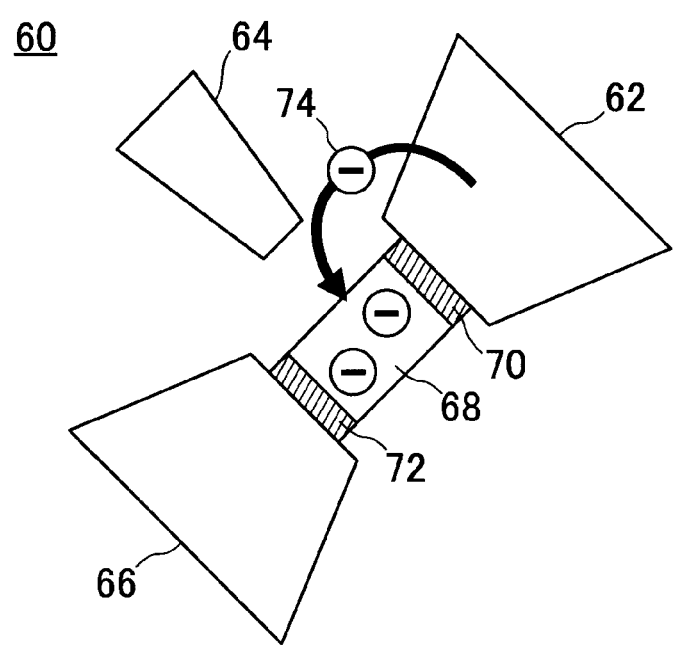
FIG. 6 is a schematic diagram illustrating an example of a single electron device as yet another embodiment of an electronic component with a functional material applied thereto, the functional material being manufactured by the method for manufacturing a functional material according to this invention.

FIG. 6 is a schematic diagram illustrating an example of a single electron device as yet another embodiment of an electronic component with a functional material applied thereto, the functional material being manufactured by the method for manufacturing a functional material according to the present invention. A single electron transistor 60 is illustrated as an example of the single electron device shown in FIG. 6. This single electron transistor 60 is composed of a source electrode 62, a gate electrode 64, a drain electrode 66, a conduction region 68, and tunnel barriers 70, 72.

For the single electron transistor 60, a voltage can be applied between the electrodes by connecting each of the source electrode 62, gate electrode 64, and drain electrode 66 to an external circuit (not shown). Between the source electrode 62 and the drain electrode 66, the conduction region 68 is provided which is connected thereto with the tunnel barriers 70, 72 respectively interposed therebetween. For the conduction region 68, a functional material is used which is manufactured by the method for manufacturing a functional material according to the present invention. The control of the conduction region 68 with a gate voltage can transfer electrons 74 one by one from the source electrode 62 to the drain electrode 66 through the tunnel barriers 70, 72.

Metal nanoparticles are used as nanoparticles of the functional material for use in the conduction region 68 as an electronic component element. In this way, the use of, for the single electron transistor 60, a porous metal complex of the metal nanoparticles closely arranged at a high density allows the transistor to operate with an electron (single electron), and allows a reduction in power consumption and suppression of heat generation. Gold, silver, copper, or the like is used as a material for the metal nanoparticles.

On the other hand, the use of the metal nanoparticles as an electromagnetic wave absorber that is an electronic component element can improve the absorption efficiency through the adjustment of the nanoparticles in terms of particle size.

It is to be noted that while the first mixed solution and the second mixed solution are separately produced and mixed with each other in the method for manufacturing a functional material according to the present embodiment, the present invention is not limited thereto, and the nanoparticles at least supported on or included in the porous metal complex may be synthesized by adding more than one particle constituent raw material constituting the nanoparticles and the porous metal complex to the solvent, and then heating the added solvent to a desired temperature.

In addition, while the complexing agent is added to the solvent in the production for each of the first mixed solution and the second mixed solution in the present embodiment, the present invention is not limited to this embodiment, and the complexing agents may not be added.

The functional material manufactured by the method for manufacturing a functional material according to this invention is used in a preferred manner for electronic components such as, for example, light-emitting elements, light-receiving elements, magnetic recording media, and single electron devices.

DESCRIPTION OF REFERENCE SYMBOLS 10 porous metal complex
12 nanoparticle
14 pore
20 light-emitting element
22 glass substrate
24 anode
26 hole transporting layer
28 light-emitting layer
30 hole blocking layer
32 electron transporting layer
34 cathode
36 hole
38 electron
40 light-receiving element
42 electron
44 semiconductor substrate
46 n-type semiconductor layer
48 i-type semiconductor layer
50 p-type semiconductor layer
52 grid electrode
54 antireflection film
60 single electron transistor
62 source electrode
64 gate electrode
66 drain electrode
68 conduction region
70 tunnel barrier
72 tunnel barrier
74 electron

The invention claimed is:

1. An electronic component comprising an electronic component element having a first electrode, a second electrode, and a functional material between the first electrode and the second electrode, the functional material comprising a porous metal complex with nanoparticles included therein, wherein the nanoparticles are composed of semiconductor nanoparticles.

2. The electronic component according to claim 1, wherein the porous metal complex has a pore size on the order of 1.2 nm.

3. The electronic component according to claim 1, wherein the nanoparticles are at least supported on the porous metal complex or included in the porous metal complex.

4. The electronic component according to claim 1, wherein the porous metal complex is in the form of a basket-shaped framework of 1.0 nm or more.

5. The electronic component according to claim 1, wherein the porous metal complex is composed of zinc nitrate and 2-methylimidazole.

6. The electronic component according to claim 1, wherein the semiconductor nanoparticles are composed of cadmium selenide, cadmium telluride, or indium phosphide.

7. An electronic component comprising an electronic component element having a first electrode, a second electrode, and a functional material between the first electrode and the second electrode, the functional material comprising a porous metal complex with nanoparticles included therein, wherein the electronic component element further comprises a hole transporting layer, a hole blocking layer, and an electron transporting layer, wherein
the hole transporting layer is on the first electrode,
the functional material is on the hole transporting layer,
the hole blocking layer is on the functional material,
the electron transporting layer is on the hole blocking layer, and
the second electrode is on the electron transporting layer.

8. An electronic component comprising an electronic component element having a first electrode, a second electrode, and a functional material between the first electrode and the second electrode, the functional material comprising a porous metal complex with nanoparticles included therein, wherein the electronic component element further comprises an n-type semiconductor layer, and a p-type semiconductor layer, wherein
the n-type semiconductor layer is on the first electrode,
the functional material is on the n-type semiconductor layer,
the p-type semiconductor layer is on the functional material,
the second electrode is on the p-type semiconductor layer, and
the second electrode is a grid electrode.

9. The electronic component according to claim 8, wherein the nanoparticles are composed of semiconductor nanoparticles.

10. The electronic component according to claim 9, wherein the semiconductor nanoparticles are composed of cadmium selenide, cadmium telluride, or indium phosphide.

11. An electronic component comprising an electronic component element having a first electrode, a second electrode, and a functional material between the first electrode and the second electrode, the functional material comprising a porous metal complex with nanoparticles included therein, wherein the electronic component element further comprises a first tunnel barrier, a second tunnel barrier, and a gate electrode that controls the functional material with a gate voltage, wherein
the first tunnel barrier is interposed between the functional material and the first electrode, and
the second tunnel barrier is interposed between the functional material and the second electrode.

12. The electronic component according to claim 11, wherein the nanoparticles are composed of magnetic nanoparticles.

13. The electronic component according to claim 12, wherein the magnetic nanoparticles are composed of a 3d transition element, a 4f transition element, an alkali metal, or an alloy thereof.

14. The electronic component according to claim 12, wherein the magnetic nanoparticles are composed of cobalt, chromium, or nickel.

15. An electronic component comprising an electronic component element having a first electrode, a second electrode, and a functional material between the first electrode and the second electrode, the functional material comprising a porous metal complex with nanoparticles included therein, wherein the nanoparticles are composed of magnetic nanoparticles.

16. The electronic component according to claim 15, wherein the magnetic nanoparticles are composed of a 3d transition element, a 4f transition element, an alkali metal, or an alloy thereof.

17. The electronic component according to claim 15, wherein the magnetic nanoparticles are composed of cobalt, chromium, or nickel.

* * * * *